United States Patent
Park et al.

(10) Patent No.: US 9,111,953 B2
(45) Date of Patent: Aug. 18, 2015

(54) INTEGRATED CIRCUIT DEVICES WITH CAPACITOR AND METHODS OF MANUFACTURING THE SAME

(71) Applicant: Samsung Electronics Co., Ltd., Suwon-si (KR)

(72) Inventors: Dongkyun Park, Hwasung (KR);
Mansug Kang, Hwasung (KR);
Hyongsoo Kim, Hwasung (KR);
Sangjun Park, Hwasung (KR); Kukhan Yoon, Hwasung (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/790,773

(22) Filed: Mar. 8, 2013

(65) Prior Publication Data

US 2013/0277802 A1    Oct. 24, 2013

(30) Foreign Application Priority Data

Apr. 18, 2012   (KR) ........................ 10-2012-0040508

(51) Int. Cl.
*H01L 49/02* (2006.01)
*H01L 27/108* (2006.01)

(52) U.S. Cl.
CPC .......... *H01L 28/60* (2013.01); *H01L 27/10852* (2013.01); *H01L 27/10894* (2013.01); *H01L 28/91* (2013.01); *H01L 28/92* (2013.01)

(58) Field of Classification Search
CPC .... H01L 28/60; H01L 28/92; H01L 27/10852
USPC .................................. 257/308, 532, E27.016
See application file for complete search history.

(56) References Cited

U.S. PATENT DOCUMENTS

| | | | |
|---|---|---|---|
| 6,537,875 B2 | 3/2003 | Won et al. | |
| 6,613,629 B2 | 9/2003 | Kim et al. | |
| 6,746,876 B2 | 6/2004 | Itoh et al. | |
| 6,756,262 B1 | 6/2004 | Nakamura et al. | |
| 2004/0089891 A1* | 5/2004 | Anma et al. .................. | 257/296 |
| 2005/0051822 A1* | 3/2005 | Manning ...................... | 257/296 |

FOREIGN PATENT DOCUMENTS

| | | |
|---|---|---|
| JP | 2001-244435 | 9/2001 |
| JP | 2003-031688 | 1/2003 |
| KR | 1020090077157 A | 7/2009 |
| KR | 1020090111018 A | 10/2009 |

* cited by examiner

*Primary Examiner* — Amar Movva
(74) *Attorney, Agent, or Firm* — Myers Bigel Sibley & Sajovec, P.A.

(57) ABSTRACT

An integrated circuit device with capacitors and methods of forming the integrated circuit device are provided. The methods may include forming a first lower capacitor electrode pattern on an inner surface of a hole in a mold layer. The first lower capacitor electrode pattern may have a hollow cylindrical shape and an opening in an upper surface. The method may further include forming a second lower capacitor electrode pattern plugging the opening and an upper surface of the second lower capacitor electrode pattern may be planar. The first and the second lower capacitor electrode patterns may comprise a lower capacitor electrode including a void. Additionally, the method may include removing the mold layer to expose the lower capacitor electrode, forming a dielectric layer on the lower capacitor electrode, and forming an upper capacitor electrode layer on the dielectric layer.

15 Claims, 23 Drawing Sheets

INTEGRATED CIRCUIT DEVICES WITH CAPACITOR AND METHODS OF MANUFACTURING THE SAME

CROSS-REFERENCE TO RELATED APPLICATIONS

This U.S. non-provisional patent application claims priority under 35 U.S.C. §119 to Korean Patent Application No. 10-2012-0040508, filed on Apr. 18, 2012, in the Korean Intellectual Property Office, the disclosure of which is hereby incorporated by reference in its entirety.

FIELD

The present disclosure generally relates to the field of electronics, and more particular to semiconductor devices.

BACKGROUND

A pillar shape lower capacitor electrode may be used for high-density integrated circuit devices, such as high-density DRAM.

The pillar shape lower capacitor electrode may include a cavity where the dielectric layer or upper electrode layer may be deposited in the cavity through the subsequent processes. The thickness of the dielectric layer or upper electrode layer may be not uniform and may cause leakage current between the upper electrode layer and the lower electrode.

SUMMARY

A method of fabricating an integrated circuit device may include forming a mold layer including a hole on a substrate. The method may further include forming a first lower capacitor electrode pattern on an inner surface of the hole while exposing an upper portion of the inner surface of the hole and the first lower capacitor electrode pattern may have a hollow cylindrical shape and an opening in a first upper surface of the first lower capacitor electrode pattern. The method may also include forming a second lower capacitor electrode pattern plugging the opening. A second upper surface of the second lower capacitor electrode pattern may be planar and the first lower capacitor electrode pattern and the second lower capacitor electrode pattern may comprise a lower capacitor electrode including a void. Additionally, the method may include removing the mold layer to expose a side and a top surface of the lower capacitor electrode, forming a dielectric layer on the side and the top surface of the lower capacitor electrode, and forming an upper capacitor electrode layer on the dielectric layer.

In various embodiments, forming the first lower capacitor electrode pattern may include forming a first lower capacitor electrode layer on the mold layer including the inner surface of the hole and removing a portion of the first lower capacitor electrode layer to expose an upper surface of the mold layer and the upper portion of the inner surface of the hole.

According to various embodiments, forming the first lower capacitor electrode layer may include forming the first lower capacitor electrode layer to enclose a cavity in the hole and removing the portion of the first lower capacitor electrode layer may include removing the portion of the first lower capacitor electrode layer to form the opening.

In various embodiments, forming the second lower capacitor electrode pattern may include forming the second lower capacitor electrode pattern to extend into the opening to contact an inner surface of the first lower capacitor electrode pattern.

According to various embodiments, forming the second lower capacitor electrode pattern may include forming the second lower capacitor electrode pattern to enclose the void.

In various embodiments, removing the mold layer may include removing the mold layer so that the top surface of the lower capacitor electrode includes a rounded edge.

According to various embodiments, forming the first lower capacitor electrode pattern may include forming the first lower capacitor electrode pattern using a CVD or ALD process at a process temperature less than 500° C.

In various embodiments, forming the second lower capacitor electrode pattern may include forming the second lower capacitor electrode pattern using a CVD or ALD process at a process temperature less than 500° C.

According to various embodiments, the first lower capacitor electrode pattern and the second lower capacitor electrode pattern may include an identical material including a metal.

In various embodiments, the first lower capacitor electrode pattern and the second lower capacitor electrode pattern may include titanium nitride.

According to various embodiments, the method may further include forming a conductive pattern on the substrate before forming the mold layer and the hole may expose an upper surface of the conductive pattern. Moreover, the method may include forming an adhesion layer on the upper surface of the conductive pattern and a portion of the inner surface of the hole before forming the first lower capacitor electrode pattern.

In various embodiments, the adhesion layer may include titanium.

An integrated circuit device may include a lower capacitor electrode including a void therein, and the lower capacitor electrode may include a first lower capacitor electrode pattern having a hollow cylindrical shape and an opening in a first upper surface of the first lower capacitor electrode pattern and a second lower capacitor electrode pattern plugging the opening. A second upper surface of the second lower capacitor electrode pattern may be planar. The integrated circuit may further include a dielectric layer on a side and a top surface of the lower capacitor electrode. The integrated circuit may also include an upper electrode layer on the dielectric layer.

In various embodiments, the top surface of the lower capacitor electrode may have a rounded edge.

According to various embodiments, the second lower capacitor electrode pattern may extend into the opening to contact an inner surface of the first lower capacitor electrode pattern.

In various embodiments, the second lower capacitor electrode pattern may enclose the void.

According to various embodiments, the first lower capacitor electrode pattern and the second lower capacitor electrode pattern may include an identical material including a metal.

In various embodiments, the first lower capacitor electrode pattern and the second lower capacitor electrode pattern may include titanium nitride.

According to various embodiments, the lower capacitor electrode may be one among a plurality of lower capacitor electrodes and the integrated circuit device may further include a supporting pattern contacting sides of two adjacent lower capacitor electrodes of the plurality of lower capacitor electrodes. A top of the void may be at an equal level or lower than a bottom surface of the supporting pattern.

In various embodiments, the supporting pattern may include silicon nitride.

DETAILED DESCRIPTION

Figure 1:
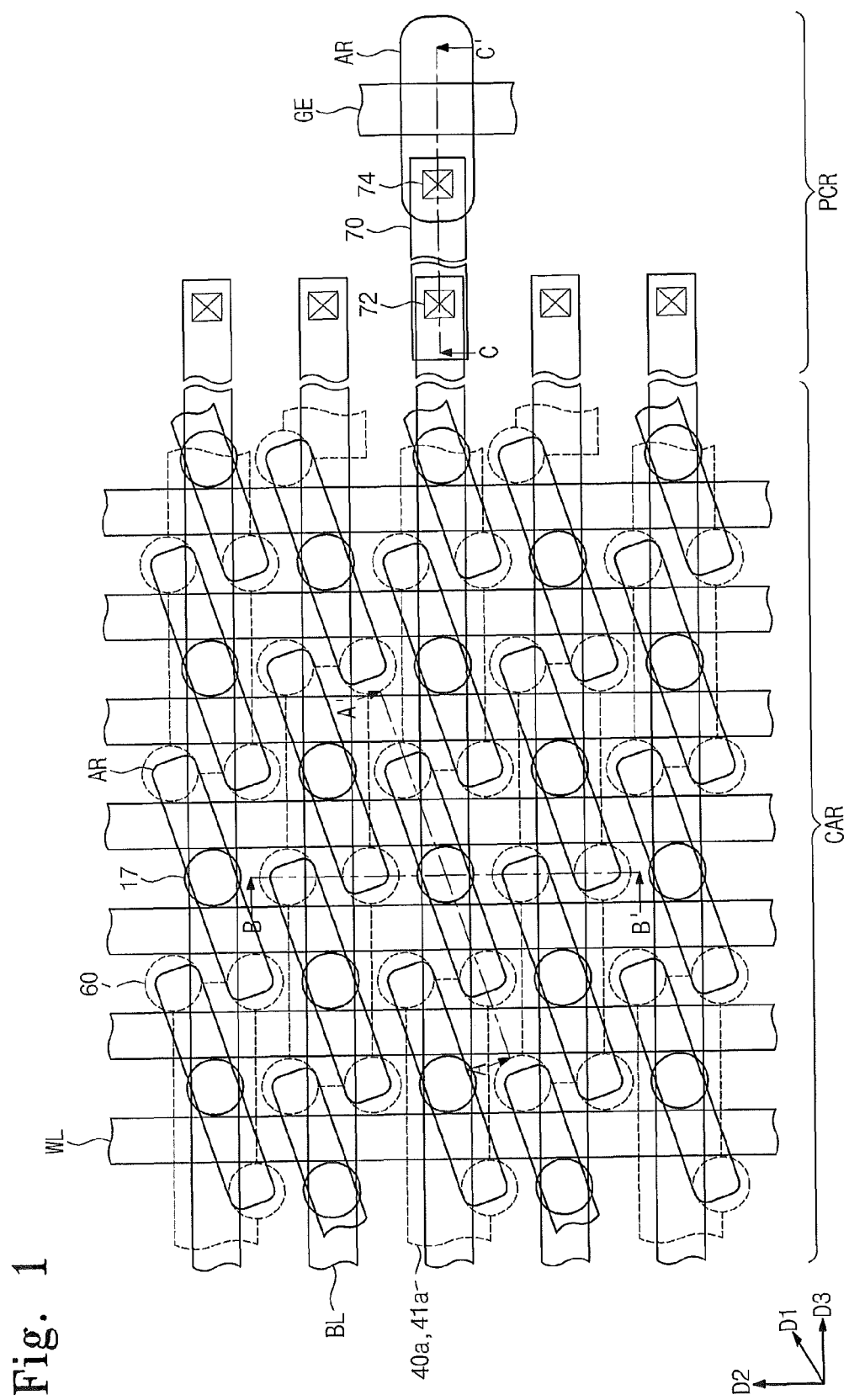
FIG. 1 is a plan view illustrating a semiconductor device according to some embodiments of the inventive concept.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments of the inventive concepts are described herein with reference to cross-sectional illustrations those are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concepts should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

Figure 2:
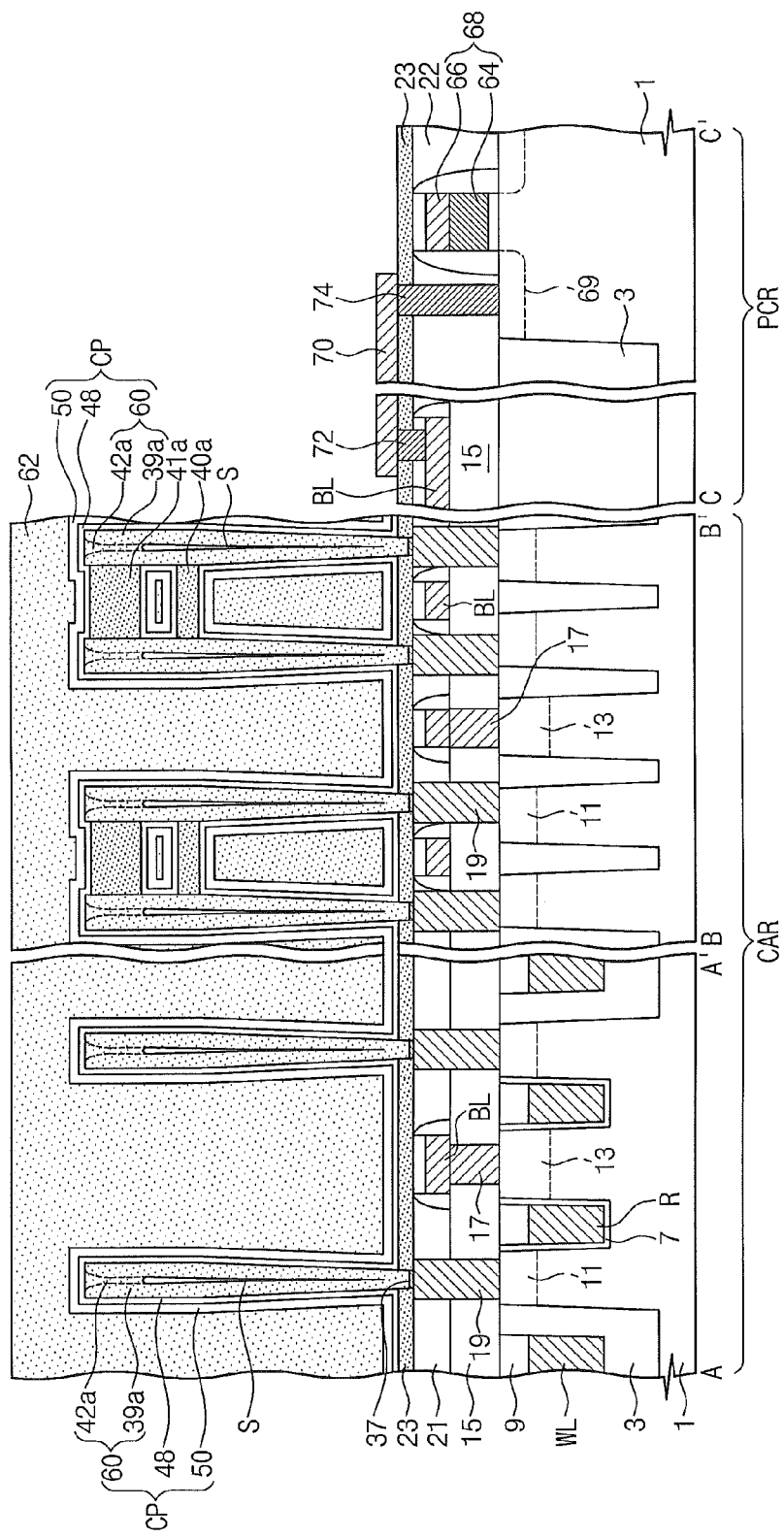
FIG. 2 is a cross-sectional view illustrating a semiconductor device according to some embodiments of the inventive concept.

FIG. 1 is a plan view illustrating a semiconductor device according to some embodiments of the inventive concept, and FIG. 2 is a cross-sectional view illustrating a semiconductor device according to some embodiments of the inventive concept. In detail, FIG. 2 is a cross-sectional view of the semiconductor device, which is taken along lines A-A', B-B', and C-C' of FIG. 1.

Referring to FIGS. 1 and 2, a substrate 1 may be provided to include a cell array region CAR and a peripheral circuit region PCR. A device isolation layer 3 may be provided in the substrate 1 to define at least one active region AR. In plan view, the active region AR may be shaped like a bar elongated along a first direction D1, and in some embodiments, there are a plurality of active regions, which may be spaced apart from and parallel to each other.

A plurality of word lines WL may be provided on the substrate 1 to cross the active region AR and the device isolation layer 3. For example, the word lines WL may extend along a second direction D2. The word lines WL may include at least one selected from the group consisting of a polysilicon layer, a metal silicide layer, and a metal layer. The second direction D2 may not be parallel to the first direction D1. The word lines WL may be provided in a recessed region R. Top surfaces of the word lines WL may be lower than a top surface of the substrate 1. Hereinafter, each of the word lines WL may be referred as to a cell gate pattern.

A gate insulating layer 7 may be interposed between the word lines WL and the substrate 1. A first doped region 11 may be provided in the substrate 1 at one side of the word line WL, and a second doped region 13 may be provided in the substrate 1 at another side of the word line WL. The second doped region 13 may be interposed between adjacent two of the word lines WL. The second doped region 13 may have a bottom surface positioned at a lower level than that of the first doped region 11. A capping layer 9 may be provided on the word lines WL. The capping layer 9 may have a top surface coplanar with that of the substrate 1.

In some embodiments, since the word lines WL are provided in the recessed region R, a cell transistor may have a recessed channel region. This enables to reduce short channel effects and furthermore decrease a leakage current in a highly integrated semiconductor device.

In the cell array region CAR, a first insulating layer 15 may be provided on the substrate 1. A bit line BL may be provided on the first insulating layer 15 to extend along a third direction D3 crossing both of the first and second directions D1 and D2. The bit line BL may be a metal-containing layer. The bit line BL may be electrically coupled to the second doped region 13 via a bit line node contact 17, which is connected to the second doped region 13 through the first insulating layer 15. The bit line node contact 17 may include at least one selected from the group consisting of a metal silicide layer, a polysilicon layer, a metal nitride layer, and a metal layer.

A second insulating layer 21 may be provided on the first insulating layer 15. A storage node contact 19 may be in contact with the first doped region 11 through the second and first insulating layers 21 and 15. The storage node contact 19 may include at least one selected from the group consisting of a metal silicide layer, a polysilicon layer, a metal nitride layer, and a metal layer. In some embodiments, the storage node contact 19 may have a multi-layered structure including, for example, a titanium layer, a titanium nitride layer, a polysilicon layer, and a cobalt silicide layer stacked sequentially.

In the peripheral circuit region PCR, a peripheral circuit gate electrode 68 may be provided on the substrate 1. The peripheral gate electrode 68 may include a first gate layer 64 and a second gate layer 66 stacked in a sequential manner. The first gate layer 64 may be a polysilicon layer, while the second gate layer 66 may be a metal-containing layer. The second gate layer 66 may include the same material as the bit line BL. In other words, gate electrodes in the peripheral circuit region may be formed of the same material as the bit line BL in the cell array region, and thus, there is no need to perform an additional deposition process for the gate electrode. This enables to simplify the fabrication process and reduce an interlayer thickness.

Peripheral doped regions 69 may be provided in the substrate 1 at both sides of the peripheral gate electrode 68. The substrate 1 of the peripheral circuit region PCR may be covered with a third insulating layer 22. An etch stop layer 23 may be provided on the second insulating layer 21 and the third insulating layer 22. Each of the first to third insulating layers 15, 21; and 22 may include a silicon oxide layer. The etch stop layer 23 may include a silicon nitride layer. The bit line BL may be electrically connected to the peripheral doped region 69 via a first contact 72 penetrating the etch stop layer 23, a wire 70 disposed on the etch stop layer 23, and a second contact 74 penetrating the etch stop layer 23 and the third insulating layer 22 to be in contact with the peripheral doped region 69.

In the cell array region CAR, a lower electrode 60 may be provided on the second insulating layer 21. The lower electrode 60 may be electrically connected to the storage node contact 19 through the etch stop layer 23. An adhesion layer 37 may be interposed between the lower electrode 60 and the storage node contact 19. In some embodiments, the adhesion layer 37 may be formed of titanium or tantalum. Due to the presence of the adhesion layer 37, it is possible to improve an adhesion property between the lower electrode 60 and the storage node contact 19.

The lower electrode 60 may be shaped like a plug or a pillar. In some embodiments, a seam S may be formed in the lower electrode 60. The lower electrode 60 may include a first lower electrode pattern 39a and a second lower electrode pattern 42a. The first lower electrode pattern 39a may define side and bottom surfaces of the seam S, and the second lower electrode pattern 42a may define a top surface of the seam S. In some embodiments, a boundary or interface between the first lower electrode pattern 39a and the second lower electrode pattern 42a may be indistinct or non-observable. For example, the first lower electrode pattern 39a and the second lower electrode pattern 42a may be continuously connected to each other without any interface to form the lower electrode 60 provided in the form of single body. In other words, the first lower electrode pattern 39a and the second lower electrode pattern 42a are distinctively shown to provide better understanding of a fabrication method according to some embodiments of the inventive concept, but some embodiments of the inventive concepts may not be limited thereto.

The seam S may be spaced apart from a bottom surface of the lower electrode 60. Accordingly, the lower electrode 60 can be electrically connected to the adhesion layer 37 and the storage node contact 19 with low contact resistance. The first lower electrode pattern 39a may include the same material as the second lower electrode pattern 42a. The first lower electrode pattern 39a and the second lower electrode pattern 42a may include a metal-containing layer, for example, a titanium nitride layer. The first and second lower electrode patterns 39a and 42a may have flat top surfaces. For example, the lower electrode 60 may have a flat top surface. Alternatively, the lower electrode 60 may be formed to have a rounded upper edge, as shown in FIG. 14B. In other words, a center of the top surface of the lower electrode 60 may be coplanar with or higher than the edge thereof.

Since the seam S is not exposed by the second lower electrode pattern 42a, it is possible to reduce a leakage current problem, which may occur when the seam S is exposed.

In some embodiments, a multi-layered supporting structure may be provided on the substrate 1. For example, the supporting structure may be provided in a form of double-layered structure including a first supporting pattern 40a and a second supporting pattern 41a sequentially stacked on the substrate 1. A sidewall of the lower electrode 60 may be in contact with at least one of the first and second supporting patterns 40a and 41a. The top surface of the lower electrode 60 may be coplanar with or higher than a top surface of the second supporting pattern 41a.

A top of the seam S may be coplanar with or lower than a bottom surface of the second supporting pattern 41a. Accordingly, even if an upper portion of the lower electrode 60 is removed during a subsequent process, it is possible to suppress the seam S from being exposed by the subsequent process. That is, the subsequent process can be performed with a process margin corresponding to a difference in height between the top surfaces of the seam S and the lower electrode 60. Therefore, it is possible to reduce the leakage current problem, which may occur when the seam S is exposed.

The first and second supporting patterns 40a and 41a may be in common contact with side surfaces of at least two of the lower electrodes 60 adjacent to each other. For example, in the plan view of FIG. 1, the first and second supporting patterns 40a and 41a may be in common contact with the side surfaces of six lower electrodes 60 those are arranged adjacent to each other. In plan view, a shape of each of the first and second supporting patterns 40a and 41a may be variously modified. The first and second supporting patterns 40a and 41a may reduce leaning of the lower electrodes 60.

A dielectric 48 may be formed to cover conformally the top and side surfaces of the lower electrode 60 and top and bottom surfaces of the first and second supporting patterns 40a and 41a. The dielectric 48 may include at least one of high-k dielectric materials, e.g., a metal oxide layer. The dielectric 48 may be conformally covered with an upper electrode layer 50. The lower electrode 60, the dielectric 48, and the upper electrode layer 50 may form a capacitor CP. The upper electrode layer 50 may be formed of, for example, a titanium nitride layer. The upper electrode layer 50 may be covered with a plate electrode layer 62. The plate electrode layer 62 may include, for example, a tungsten layer. The plate electrode layer 62 may be formed to fill spaces between the lower electrodes 60, between the first and second supporting patterns 40a and 41a, and between the lower electrode 60 and the first and second supporting patterns 40a and 41a adjacent thereto.

FIGS. 3 through 13, 14A, 15, and 16 are cross-sectional views that illustrate a process of fabricating a semiconductor device according to some embodiments of the inventive concept and are taken along lines A-A' and B-B' of FIG. 1. FIG. 14B is an enlarged view of a portion P of FIG. 14A.

Figure 3:
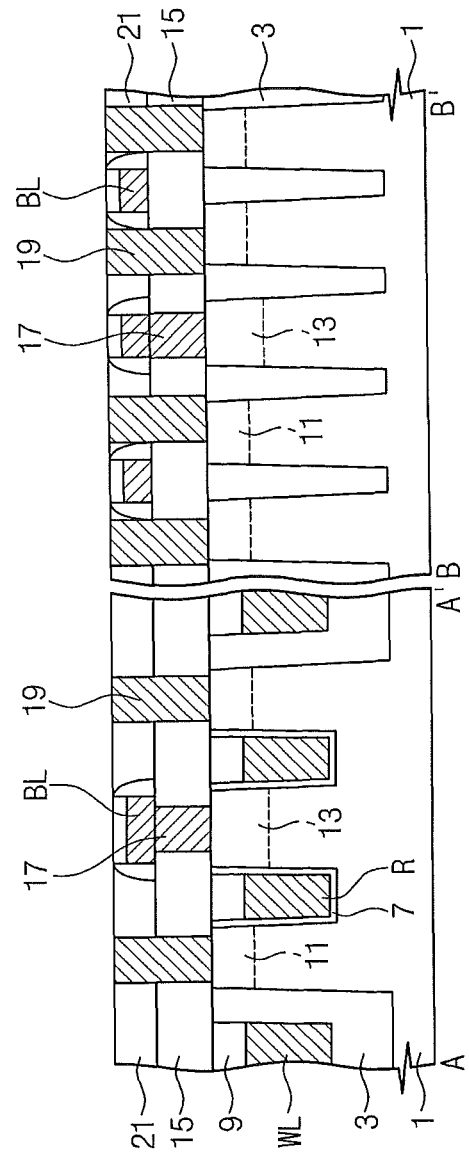
FIGS. 3 through 13, 14A, 15, and 16 are cross-sectional views illustrating a process of fabricating a semiconductor device according to some embodiments of the inventive concept.

Referring to FIGS. 1 and 3, the device isolation layer 3 may be formed in the substrate 1 to define the active region AR. In some embodiments, the device isolation layer 3 may be formed by a shallow-trench isolation (STI) process. The substrate 1 provided with the device isolation layer 3 may be patterned to form a plurality of line-shaped recessed regions R extending along the second direction D2.

The recessed regions R may be formed to cross the active region AR and the device isolation layer 3. The gate insulating layer 7 may be formed on a surface of the substrate 1 exposed by the recessed region R. The gate insulating layer 7 may be formed of, for example, a thermal oxide layer. A conductive layer may be deposited to fill the recessed region R provided with the gate insulating layer 7 and be recessed to form the word line WL. The capping layer 9 may be formed on the word line WL to fill the remaining portion of the recessed region R.

A plurality of ion implantation processes may be performed to form the first and second doped regions 11 and 13 in the substrate 1 adjacent to the word line WL. The second doped region 13 may be formed to be deeper than the first doped region 11. The first insulating layer 15 may be formed to cover the substrate 1. The bit line node contact 17 may be formed to penetrate the first insulating layer 15 and be in contact with the second doped region 13. A conductive layer may be deposited on the first insulating layer 15 and be patterned to form the bit line BL connected to the bit line node contact 17. A peripheral circuit transistor may be formed in the peripheral circuit region PCR during or by the process of forming the bit line node contact 17 and the bit line BL in the cell array region CAR. The second insulating layer 21 may be formed to cover the bit line BL, and then, be planarized. The storage node contact 19 may be formed to penetrate the second insulating layer 21 and the first insulating layer 15 and be in contact with the first doped region 11.

Figure 4:
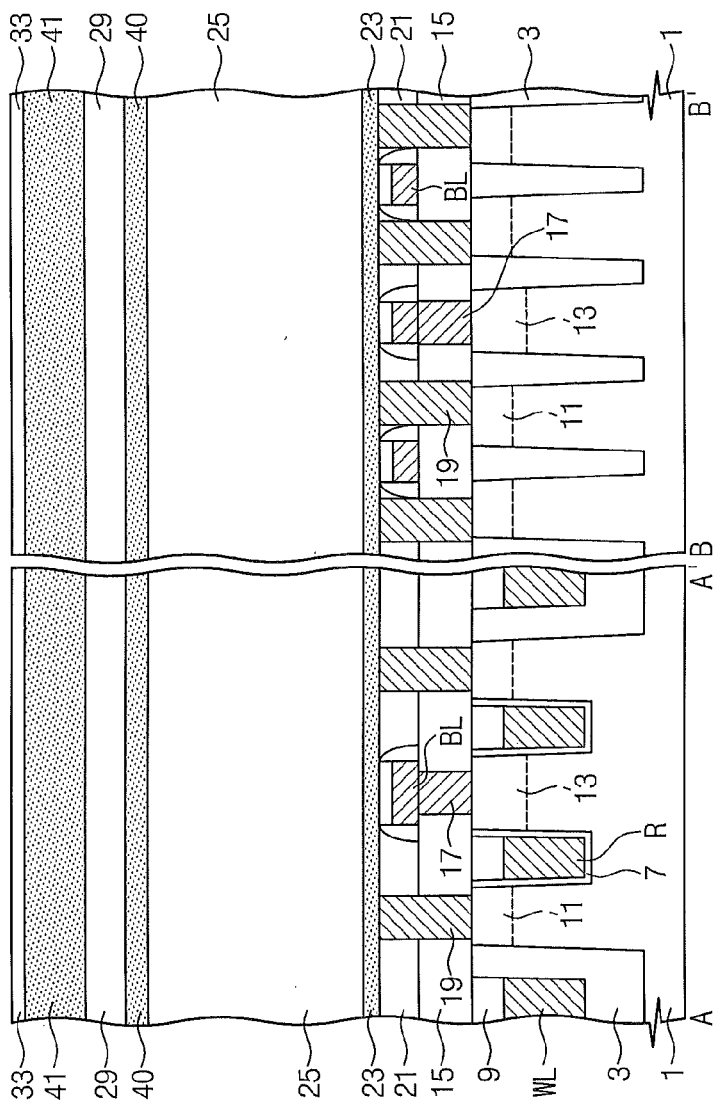

Referring to FIG. 4, the etch stop layer 23 may be formed on the second insulating layer 21. Mold layers and supporting layers may be alternatingly stacked on the etch stop layer 23. For example, a first mold layer 25, a first supporting layer 40, a second mold layer 29, a second supporting layer 41, and a third mold layer 33 may be sequentially stacked on the etch stop layer 23. The first and second insulating layers 15 and 21 may be formed of a silicon oxide layer. The first to third mold layers 25, 29, and 33 may be formed of a silicon oxide layer or a polysilicon layer. The etch stop layer 23 and the first and second supporting layers 40 and 41 may be formed of a silicon nitride layer.

Figure 5:
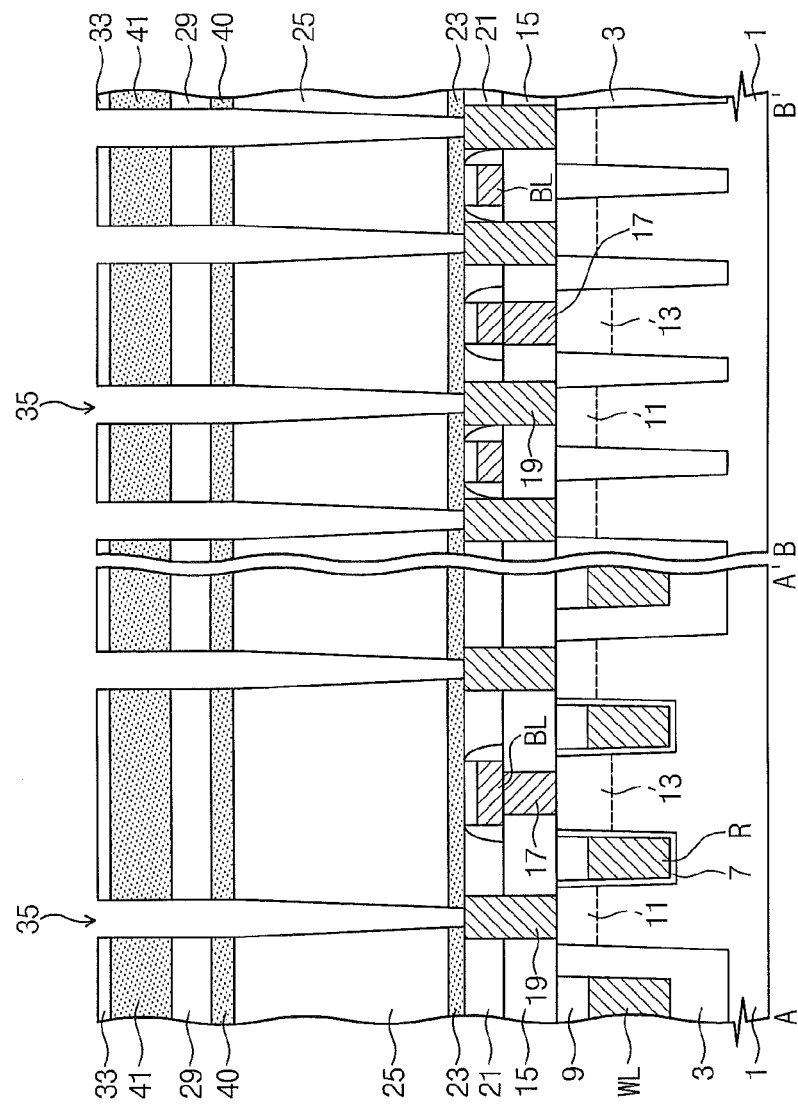

Referring to FIG. 5, the third mold layer 33, the second supporting layer 41, the second mold layer 29, the first supporting layer 40, the first mold layer 25, and the etch stop layer 23 may be sequentially patterned to form a lower electrode hole 35 exposing the storage node contact 19.

Figure 6:
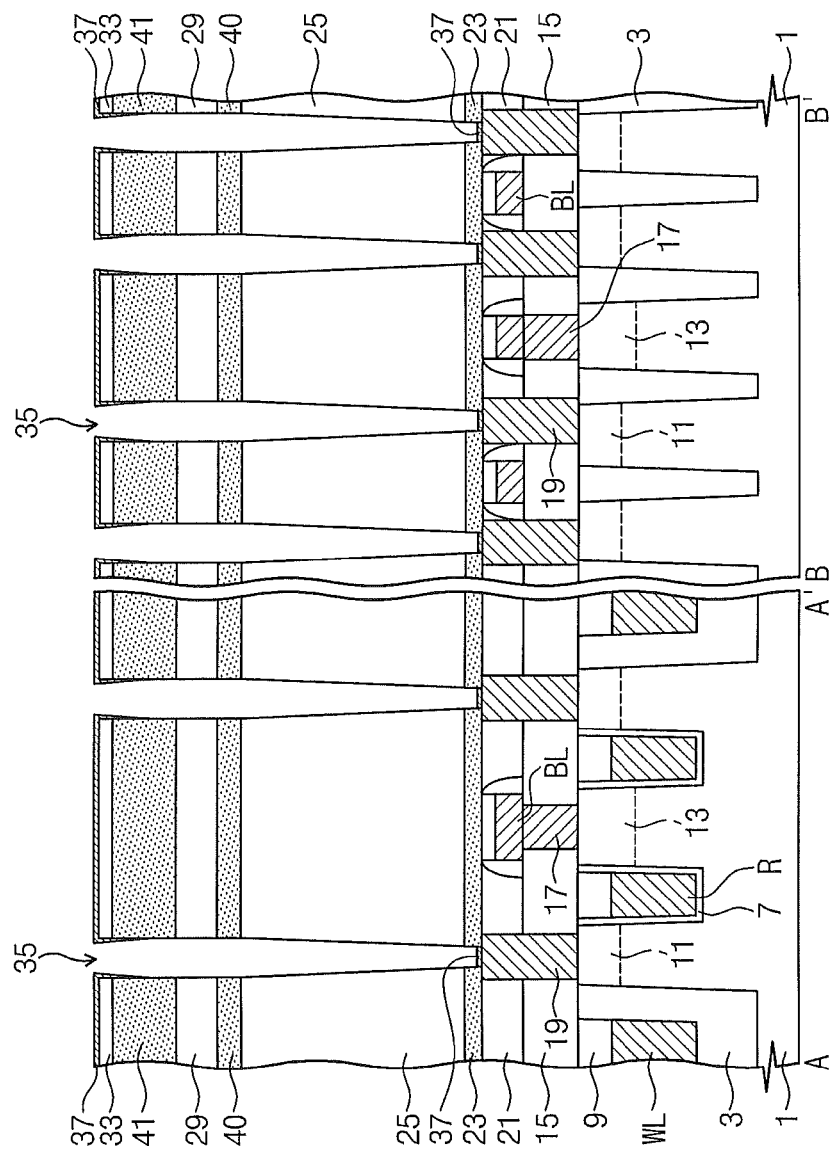

Referring to FIG. 6, the adhesion layer 37 may be formed using, for example, plasma-enhanced chemical vapor deposition (PECVD) to cover a top surface of the storage node contact 19 exposed by the lower electrode hole 35. The adhesion layer 37 may be formed on a top surface of the third mold layer 33 and an upper side surface of the lower electrode hole 35, thereby narrowing an entrance of the lower electrode hole 35. The adhesion layer 37 may be formed of, for example, a titanium layer.

Figure 7:
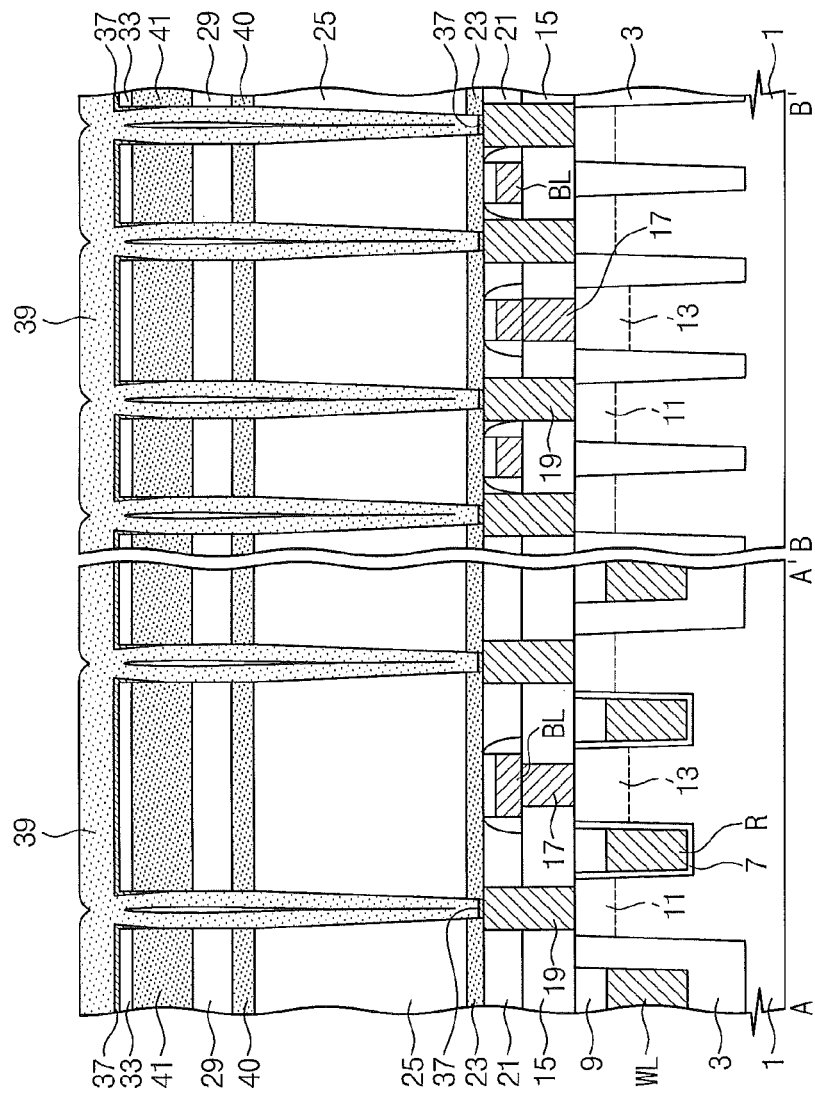

Referring to FIG. 7, a first lower electrode layer 39 may be deposited to fill the lower electrode hole 35. The first lower electrode layer 39 may be formed to have the seam S in the lower electrode hole 35. In some embodiments, the top of the seam S may be formed to be higher than the top surface of the second supporting layer 41. The bottom of the seam S may be formed spaced apart from the adhesion layer 37. As described above, due to the presence of the adhesion layer 37 on the upper sidewall of the lower electrode hole 35, the entrance of the lower electrode hole 35 has a reduced width. As a result, the entrance of the lower electrode hole 35 may be sealed by the first lower electrode layer 39, during the deposition of the first lower electrode layer 39, and this may result in the formation of the seam S that is not occupied by the first lower electrode layer 39. The first lower electrode layer 39 may be formed of, for example, a titanium nitride layer.

In some embodiments, the first lower electrode layer 39 may be formed using a deposition technique with a good step coverage property, for example, an atomic layer deposition process. Alternatively, the first lower electrode layer 39 may be formed by a chemical vapor deposition process, but in this case, to obtain a good step coverage property, the chemical vapor deposition process may be performed at a temperature of 500° C. or less. Even in the case where the first lower electrode layer 39 is formed by the atomic layer deposition process, the process temperature may be less than 500° C. This may be because when the process temperature is less than 500° C., the first lower electrode layer 39 can be formed to have a relatively small grain and this leads to a good step coverage property. In addition, this enables to form an expanded entrance of the first lower electrode pattern 39a during a subsequent blanket etch-back process for forming the first lower electrode pattern 39a by exposing the seam S. Furthermore, the expanded entrance of the first lower electrode pattern 39a enables to supply a deposition gas for forming a second lower electrode layer 42 into the first lower electrode pattern 39a with ease.

Figure 8:
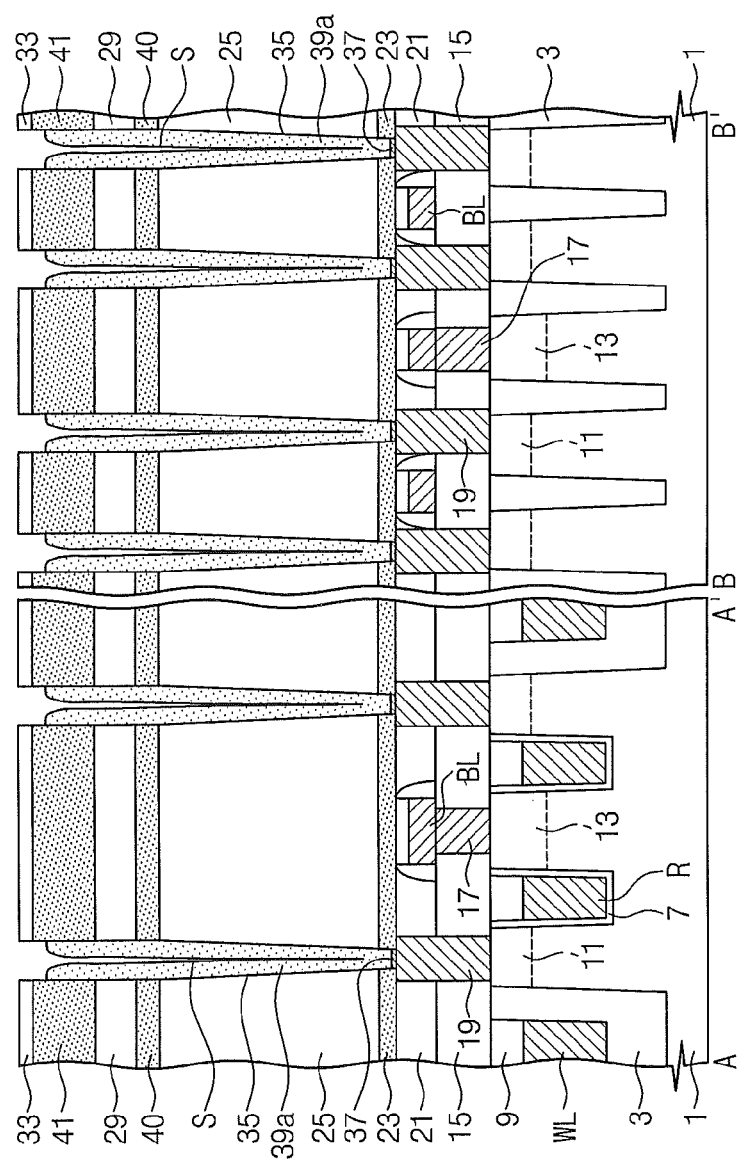

Referring to FIG. 8, the blanket etch-back process may be performed to the first lower electrode layer 39 to remove the adhesion layer 37 and the first lower electrode layer 39 from the top surface of the third mold layer 33 and the upper sidewall of the lower electrode hole 35. In other words, the top surface of the third mold layer 33 and the upper sidewall of the lower electrode hole 35 may be exposed as the result of the blanket etch-back process. In addition, an upper sidewall of the second supporting layer 41 may be partially exposed by the blanket etch-back process. Accordingly, the seam S may be exposed and the first lower electrode pattern 39a may be formed to have a shape of cup or open-top cylinder. In some embodiments, the adhesion layer 37 may be wholly removed, but some embodiments of the inventive concepts may not be limited thereto.

Figure 9:
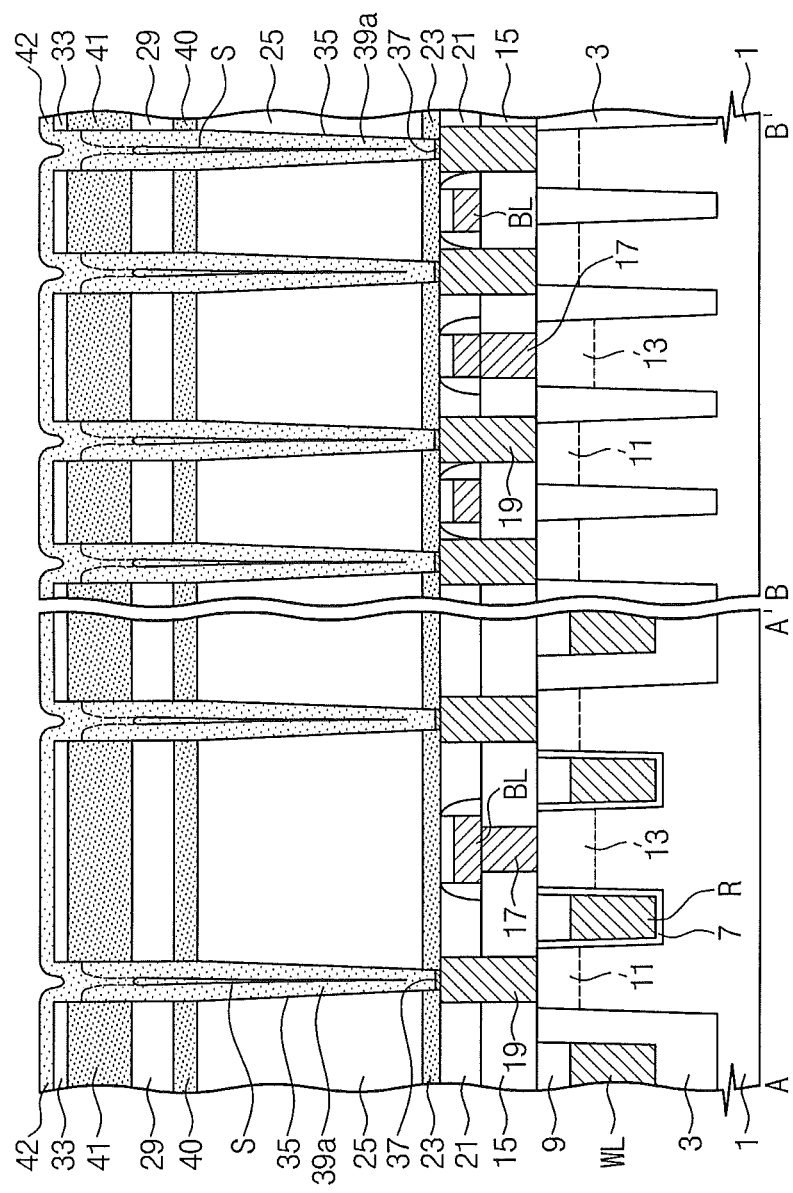

Referring to FIG. 9, the second lower electrode layer 42 may be conformally formed on the substrate 1 provided with the first lower electrode pattern 39a. In some embodiments, the second lower electrode layer 42 may be formed using a deposition technique with a good step coverage property, for example, an atomic layer deposition process. Alternatively, the second lower electrode layer 42 may be formed by a chemical vapor deposition process, but in this case, to obtain a good step coverage property, the chemical vapor deposition process may be performed at a temperature of 500° C. or less. The second lower electrode layer 42 may be formed of the same material as the first lower electrode layer 39 (for example, a titanium nitride layer). The second lower electrode layer 42 may be formed to fill a portion of an empty space that is delimited by sidewalls of the first lower electrode pattern 39a. For example, the second lower electrode layer 42 may be formed to seal a top entrance of the first lower electrode pattern 39a. Accordingly, the entrance of the seam S may be sealed with the second lower electrode layer 42.

In some embodiments, the second lower electrode layer 42 may be formed in such a way that the top of the seam S may be located at a level coplanar with or lower than the bottom surface of the second supporting layer 41. In the case where the second lower electrode layer 42 is formed of the same material as the first lower electrode pattern 39a, a boundary or interface therebetween may be indistinct or non-observable. This may be because the second lower electrode layer 42 includes a layer grown from a surface or grains of the first lower electrode pattern 39a that exposed in the atomic layer deposition process. In other words, although the second lower electrode layer 42 and the first lower electrode pattern 39a are distinctively shown to provide better understanding of a fabrication method according to some embodiments of the inventive concept, some embodiments of the inventive concepts may not be limited thereto.

Figure 10:
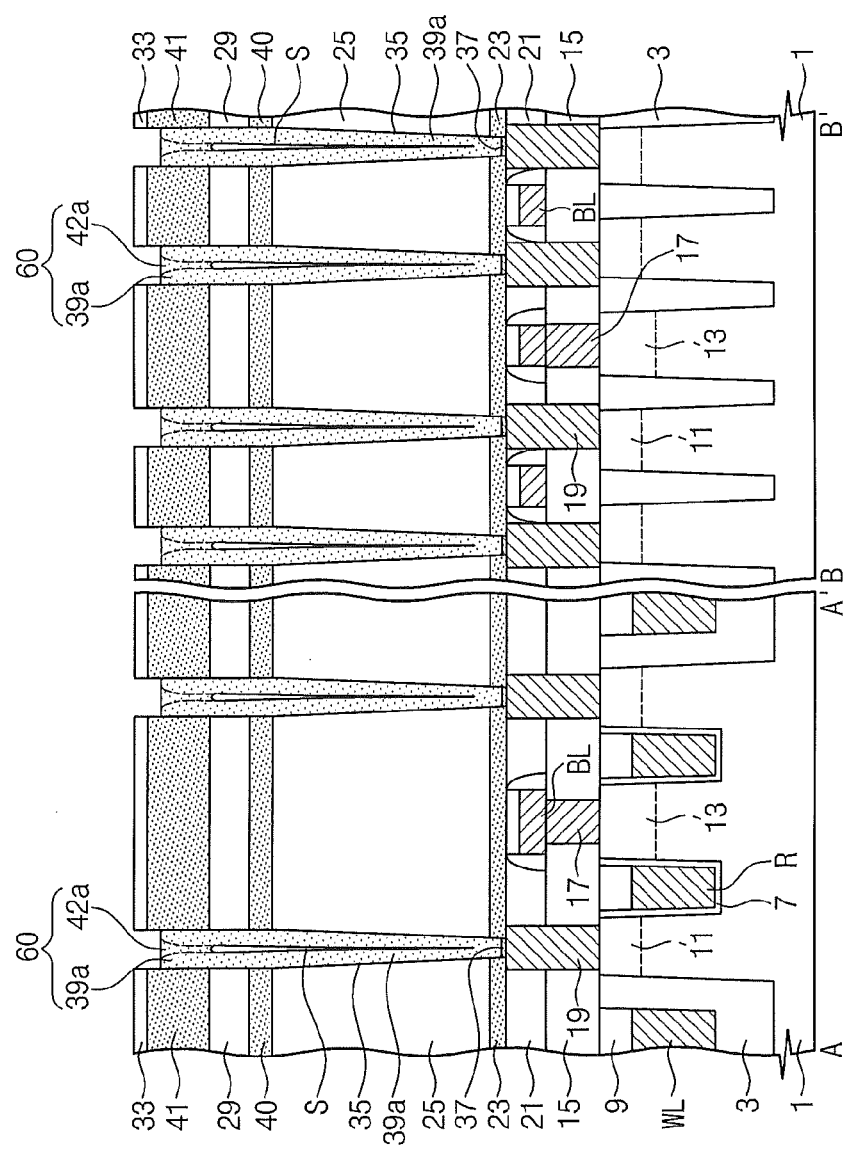

Referring to FIG. 10, a blanket etch-back process may be performed to the second lower electrode layer 42 to remove the second lower electrode layer 42 from a top surface of the third mold layer 33 and the upper sidewall of the lower electrode hole 35. In other words, the top surface of the third mold layer 33 and the upper sidewall of the lower electrode hole 35 may be re-exposed as the result of the blanket etch-back process. Accordingly, the second lower electrode pattern 42a may be formed to seal the top of the seam S and have a flat top surface. In some embodiments, the first lower electrode pattern 39a and the second lower electrode pattern 42a may constitute the lower electrode 60.

As described above, the formation of the lower electrode 60 may include repeating two times a deposition process and a blanket etch-back process, and this enables to lower a vertical position of the top of the seam S relative to the lower electrode 60 and reduce the seam S from being exposed. As a result, it is possible to reduce a leakage current problem, which may occur when the seam S is exposed.

Figure 11:
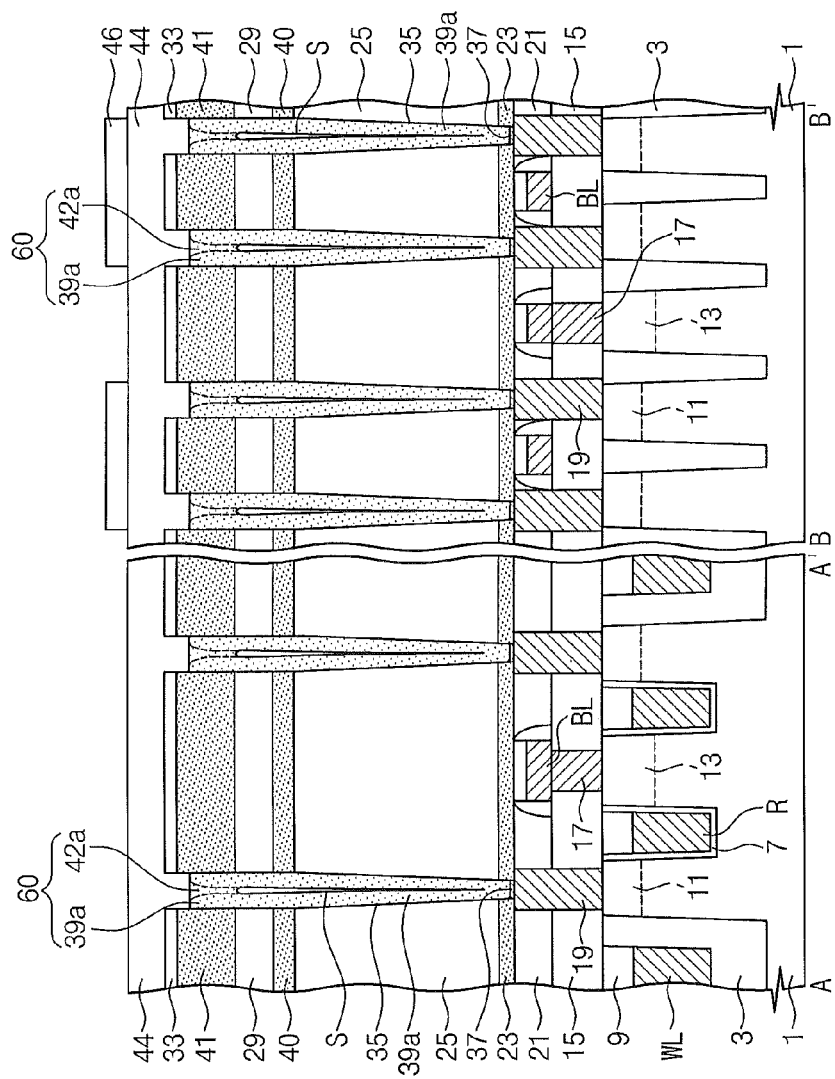

Referring to FIG. 11, a planarization layer 44 may be formed on the third mold layer 33 to fill the upper portion of the lower electrode hole 35. The planarization layer 44 may include a silicon oxide layer (e.g., a spin-on-glass (SOG) layer) or a carbon-containing layer (e.g., a spin-on-carbon (SOC) layer). A mask pattern 46 may be formed on the planarization layer 44. The mask pattern 46 may be formed of a material having etch selectivity with respect to the planarization layer 44. The mask pattern 46 may be formed of, for example, a silicon nitride layer or a silicon oxide nitride layer. The mask pattern 46 may be formed to define disposition or shape of the supporting pattern. For example, the mask pattern 46 may be formed to connect at least two of the lower electrodes 60 adjacent to each other.

Figure 12:
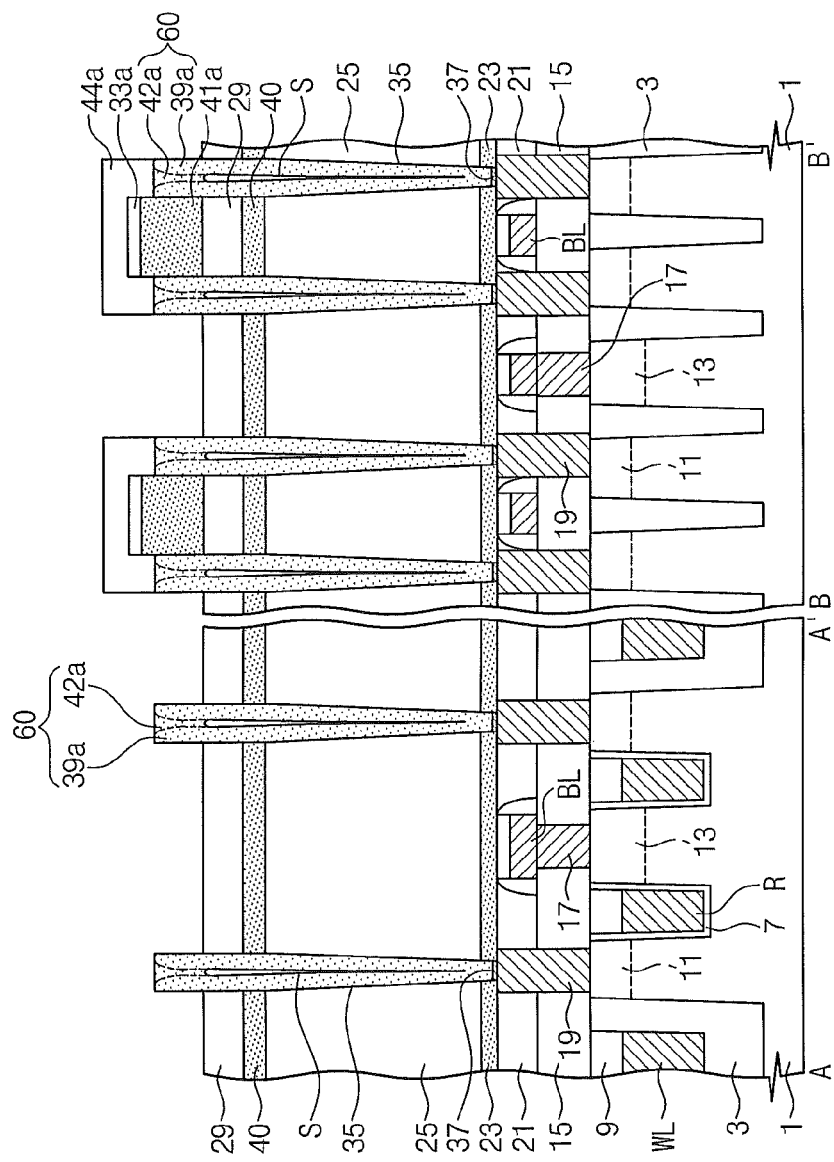

Referring to FIG. 12, the planarization layer 44 and the third mold layer 33 may be sequentially etched using the mask pattern 46 as an etch mask to form a planarization pattern 44a and a third mold pattern 33a below the mask pattern 46 and expose the second supporting layer 41. The second supporting layer 41 may be etched using the planarization pattern 44a as an etch mask to form the second supporting pattern 41a and expose the second mold layer 29. In some embodiments, the mask pattern 46 may be wholly removed, during the etching of the second supporting layer 41.

Figure 13:
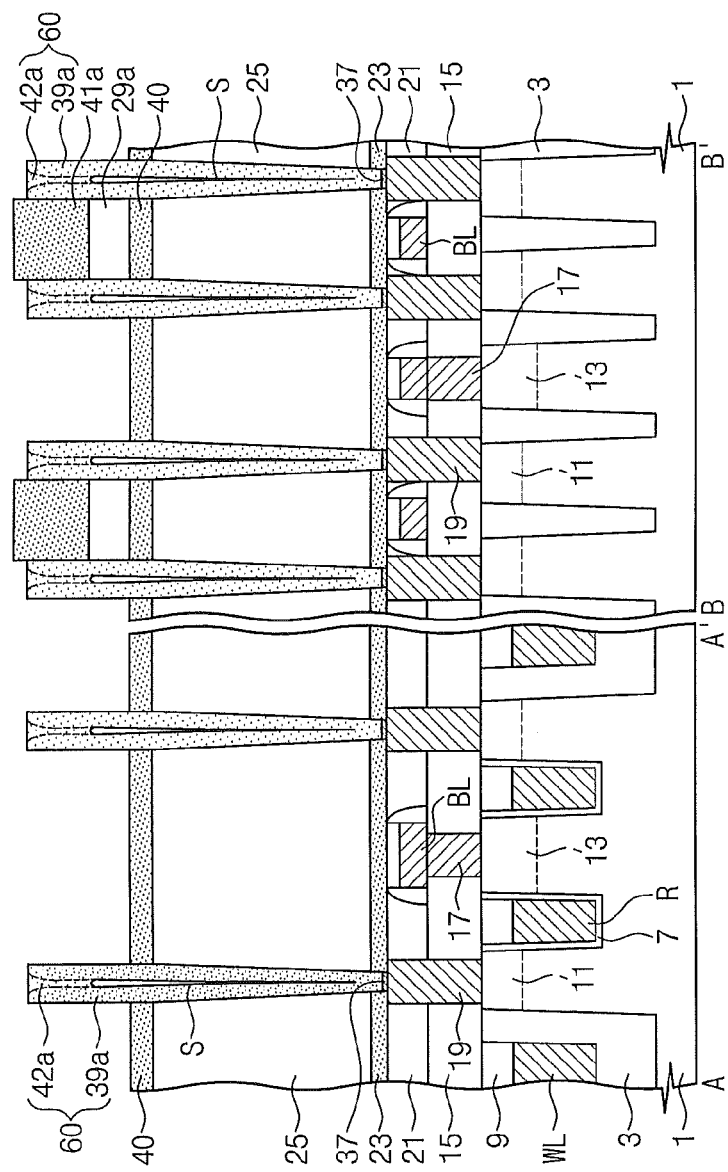

Referring to FIG. 13, the second mold layer 29 may be etched using the second supporting pattern 41a as an etch mask to form a second mold pattern 29a and expose the first supporting layer 40. In some embodiments, the planarization pattern 44a and the third mold pattern 33a may be wholly removed, during the etching of the second mold layer 29.

Figure 14A:
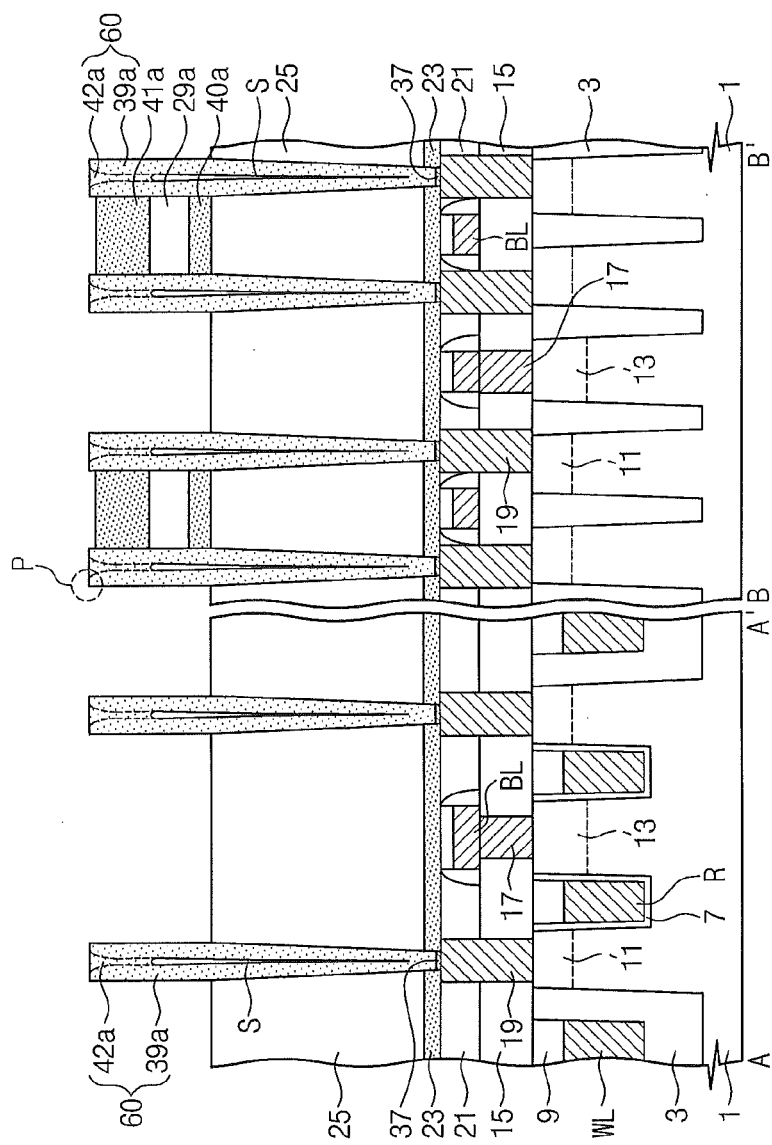
Figure 14B:
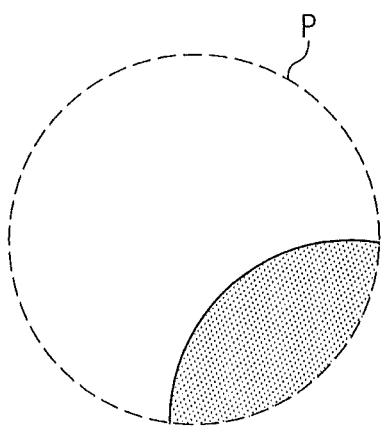
FIG. 14B is an enlarged view of a portion P of FIG. 14A.

Referring to FIGS. 14A and 14B, a blanket etch-back process may be performed to remove a portion of the first supporting layer 40, which is not overlapped with the second supporting pattern 41a, and expose the first mold layer 25. During the etching of the first supporting layer 40, an upper portion of the second supporting pattern 41a may be partially etched, and in this case, the second supporting pattern 41a may be formed to have a top surface lower than that of the lower electrode 60. As the result of the etching processes, an edge P of the lower electrode 60 may be etched to have a rounded shape as shown in FIG. 14B. Accordingly, a center of the top surface of the lower electrode 60 may be formed to have a height coplanar with or higher than the edge thereof.

Figure 15:
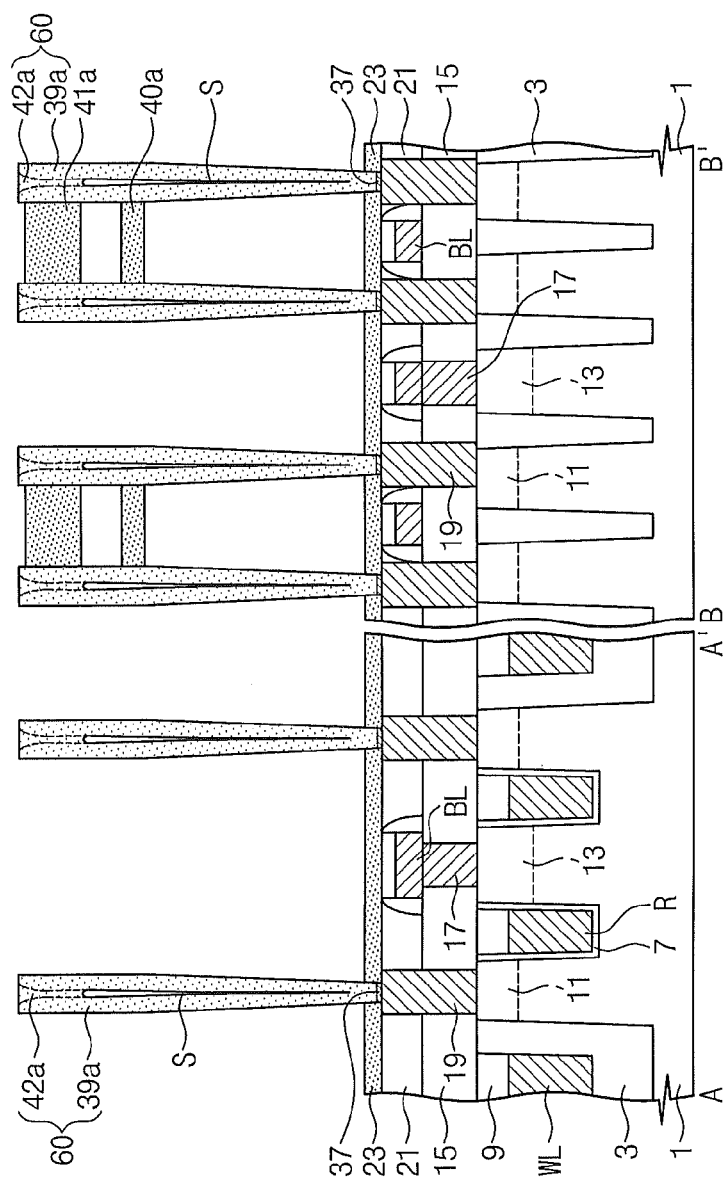

Referring to FIG. 15, exposed portions of the first mold layer 25, the second mold pattern 29a, and the third mold pattern 33a may be selectively removed to expose the side and top surfaces of the lower electrode 60, the top surface of the etch stop layer 23, and the top and bottom surfaces of the first and second supporting patterns 40a and 41a. The first and second supporting patterns 40a and 41a may be formed to be in common contact with at least two of the lower electrodes 60 adjacent to each other, and this reduces the lower electrodes 60 from leaning.

Figure 16:
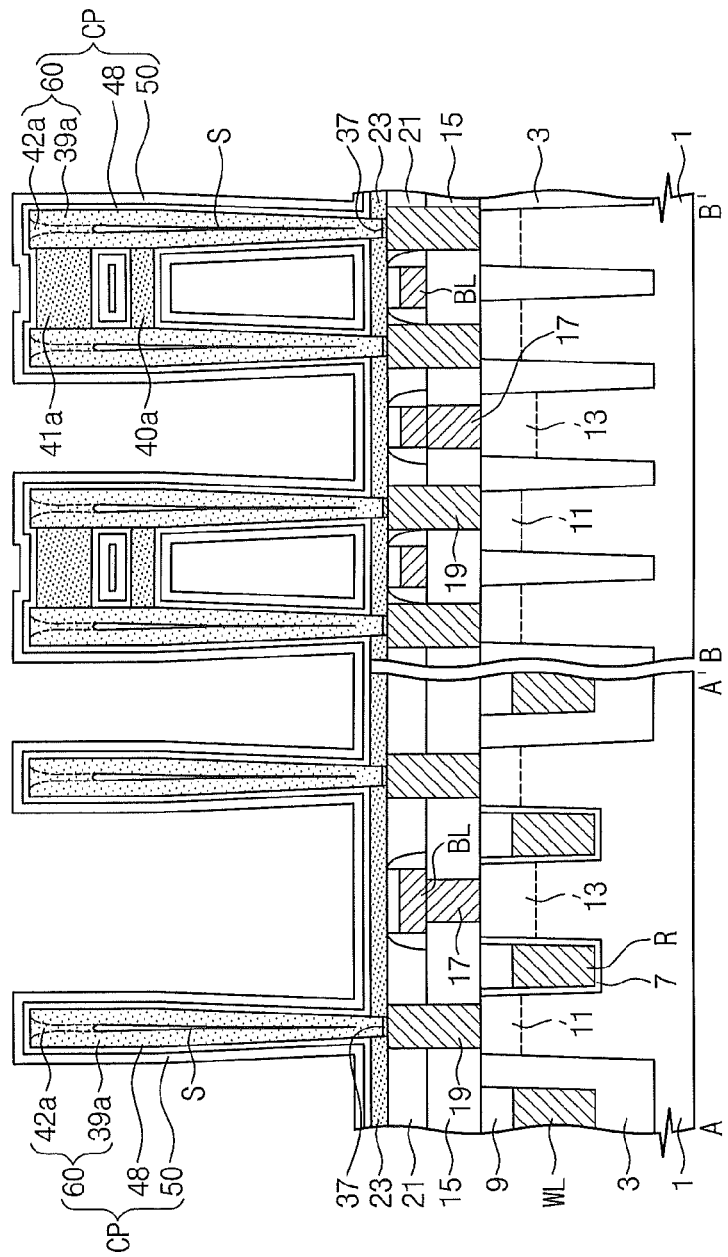

Referring to FIG. 16, the dielectric 48 and the upper electrode layer 50 may be sequentially formed to cover conformally the side and top surfaces of the lower electrode 60, the top surface of the etch stop layer 23, and the top and bottom surfaces of the first and second supporting patterns 40a and 41a. The dielectric 48 may include at least one of high-k dielectric materials, e.g., a metal oxide layer. The upper electrode layer 50 may include, for example, a titanium nitride layer.

Thereafter, referring back to FIG. 2, the plate electrode 60 may be formed to fill unfilled spaces (for example, between the lower electrodes 60 and between the first and second supporting patterns 40a and 41a). The first and second contacts 72 and 74 and the wire 70 may be formed on the peripheral circuit region.

Figure 17:
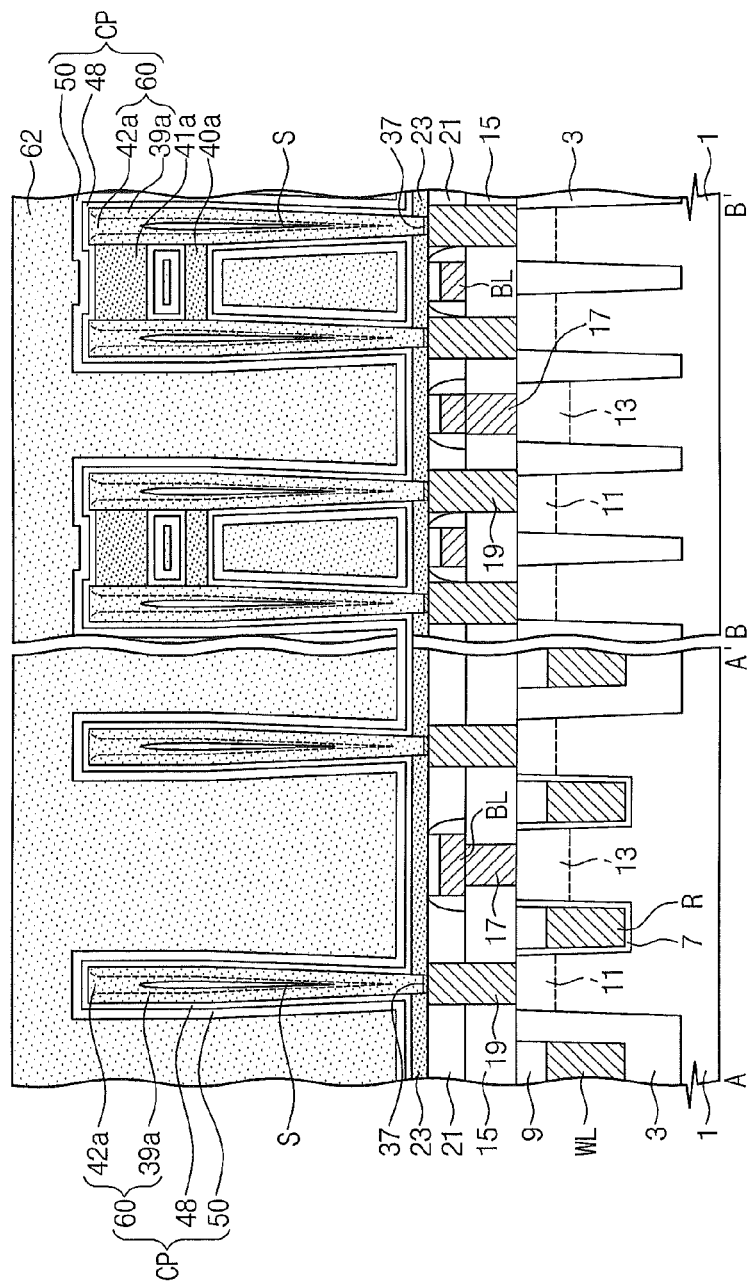
FIG. 17 is a cross-sectional view illustrating a semiconductor device according to some embodiments of the inventive concept.

FIG. 17 is a cross-sectional view illustrating a semiconductor device according to some embodiments of the inventive concept. In detail, FIG. 17 may be a cross-sectional view of the semiconductor device, which is taken along lines A-A' and B-B' of FIG. 1.

Referring to FIG. 17, according to the present embodiment, the lower electrode 60 may include the first lower electrode pattern 39a and the second lower electrode pattern 42a covering an inner surface of the first lower electrode pattern 39*a* and defining the seam S. In other words, the seam S may be formed in the second lower electrode pattern 42*a*, and the first lower electrode pattern 39*a* may cover an outer side surface of the second lower electrode pattern 42*a*. Except for this, the semiconductor device according to the present embodiment may have the same structure as that of FIG. 2.

Figure 18:
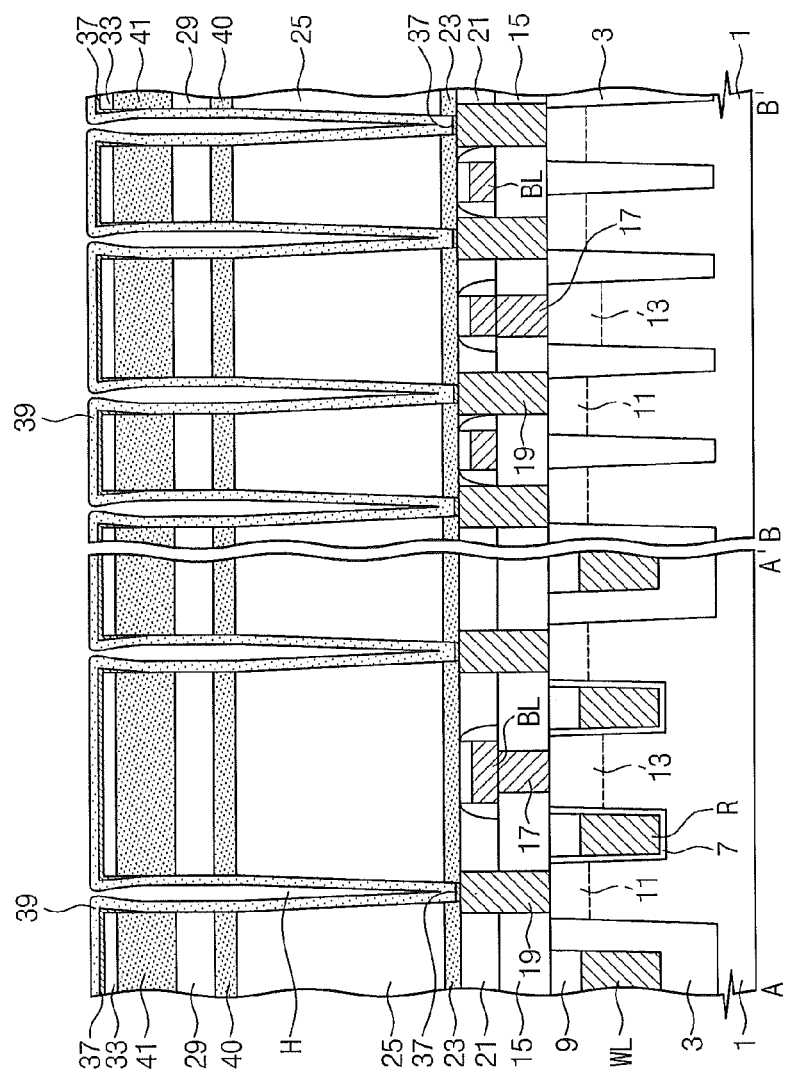
FIGS. 18 through 20 are cross-sectional views illustrating a process of fabricating a semiconductor device according to some embodiments of the inventive concept.
Figure 19:
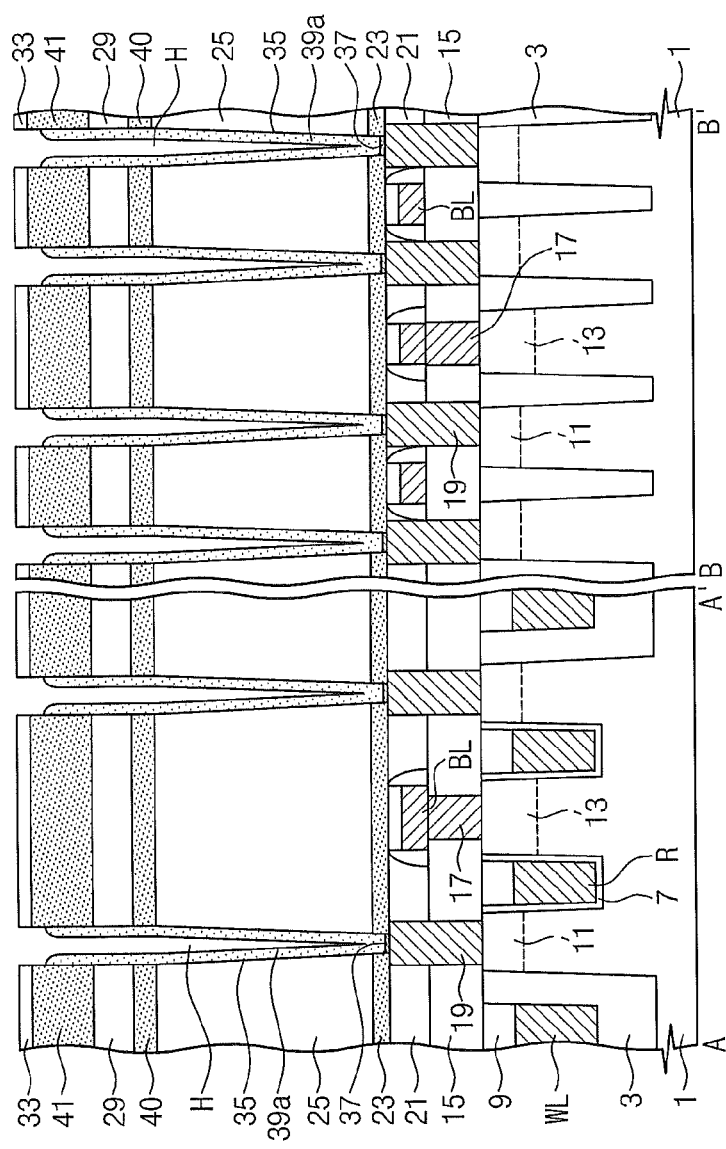
Figure 20:
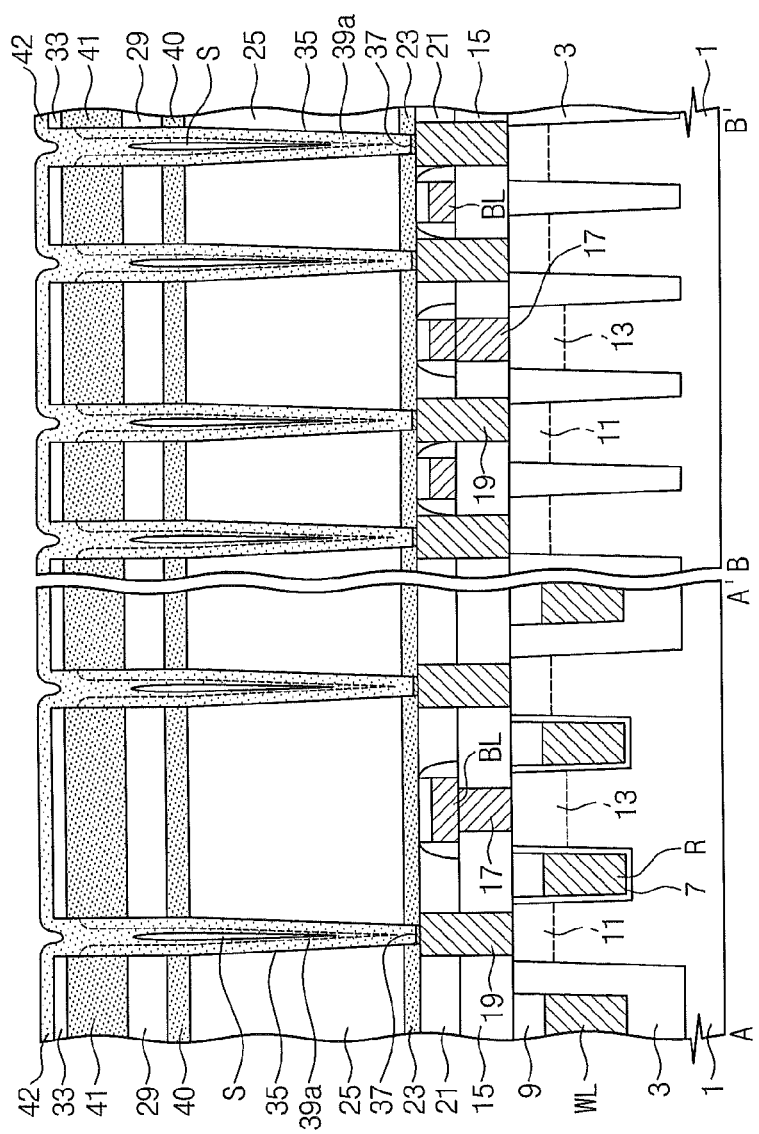

FIGS. 18 through 20 are cross-sectional views illustrating a process of fabricating a semiconductor device according to other some embodiments of the inventive concept. In detail, FIGS. 18 through 20 may be cross-sectional views of the process, which are taken along lines A-A' and B-B' of FIG. 1.

Referring to FIG. 18, the first lower electrode layer 39 may be conformally formed on the structure of FIG. 6. In the present embodiment, a deposition thickness of the first lower electrode layer 39 may be too thin to seal the entrance of the lower electrode hole 35. Accordingly, the first lower electrode layer 39 may be formed to have a shape of cup or open-top cylinder in the lower electrode hole 35.

Referring to FIG. 19, a blanket etch-back process may be performed to the first lower electrode layer 39 to remove the adhesion layer 37 and the first lower electrode layer 39 from the top surface of the third mold layer 33 and the upper sidewall of the lower electrode hole 35. In other words, the top surface of the third mold layer 33 and the upper sidewall of the lower electrode hole 35 may be exposed as the result of the blanket etch-back process. As the result of the blanket etch-back process, the first lower electrode pattern 39*a* may be formed to have a shape of cup or open-top cylinder.

Referring to FIG. 20, the second lower electrode layer 42 may be conformally formed on the structure provided with the first lower electrode pattern 39*a*. In some embodiments, the second lower electrode layer 42 may be formed using a deposition technique with a good step coverage property, for example, an atomic layer deposition process. Alternatively, the second lower electrode layer 42 may be formed by a chemical vapor deposition process, but in this case, to obtain a good step coverage property, the chemical vapor deposition process may be performed at a temperature of 500° C. or less. The second lower electrode layer 42 may be formed of the same material as the first lower electrode layer 39 (for example, a titanium nitride layer). The second lower electrode layer 42 may be formed to fill a portion of an empty space that is delimited by sidewalls of the first lower electrode pattern 39*a*.

According to some embodiment, the first lower electrode pattern 39*a* may have an inner space wider than that described with reference to FIG. 8, and thus, the second lower electrode layer 42 may be formed to cover the inner space of the first lower electrode pattern 39*a*. In other words, the second lower electrode layer 42 may be formed to cover the inner sidewall of the first lower electrode pattern 39*a* and have the seam S therein. In some embodiments, the second lower electrode layer 42 may be formed in such a way that the top of the seam S may be located at a level coplanar with or lower than the bottom surface of the second supporting layer 41.

The subsequent process may be performed in the same or similar manner as that in the previous embodiments described with reference to FIGS. 10 through 16, thereby forming the semiconductor device of FIG. 17.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor memory device according to one of the above embodiments is mounted may further include at least one semiconductor device (e.g., a controller and/or a logic device) that controls the semiconductor memory device.

Figure 21:
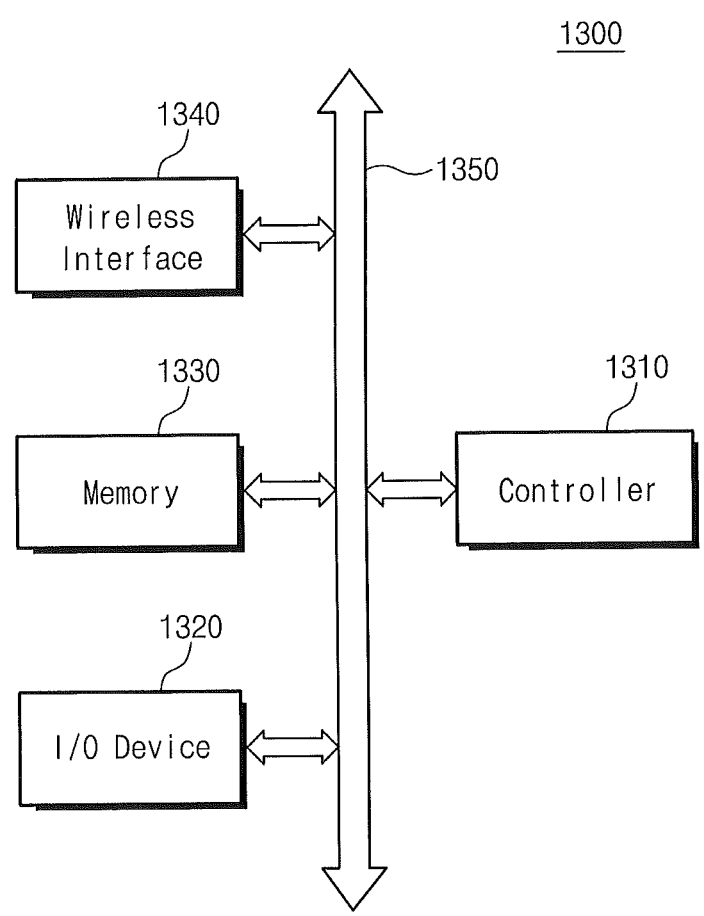
FIG. 21 is a block diagram schematically illustrating electronic devices including a semiconductor device according to some embodiments of the inventive concept.

FIG. 21 is a block diagram schematically illustrating electronic devices including a semiconductor device according to some embodiments of the inventive concept.

Referring to FIG. 21, an electronic device 1300 including a semiconductor device according to some embodiments of the inventive concepts may be used in one of a personal digital assistant, a laptop computer, a mobile computer, a web tablet, a wireless phone, a cell phone, a digital music player, a wire or wireless electronic device, or a complex electronic device including at least two thereof.

The electronic device 1300 may include a controller 1310, an input/output device 1320 such as a keypad, a keyboard, a display, a memory 1330, and a wireless interface 1340 those are combined to each other through a bus 1350. The controller 1310 may include, for example, at least one microprocessor, a digital signal process, a microcontroller or the like. The memory 1330 may be configured to store a command code to be used by the controller 1310 or a user data. The memory 1330 may include a semiconductor device including a capacitor according to some embodiments of the inventive concepts.

The electronic device 1300 may use a wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Figure 22:
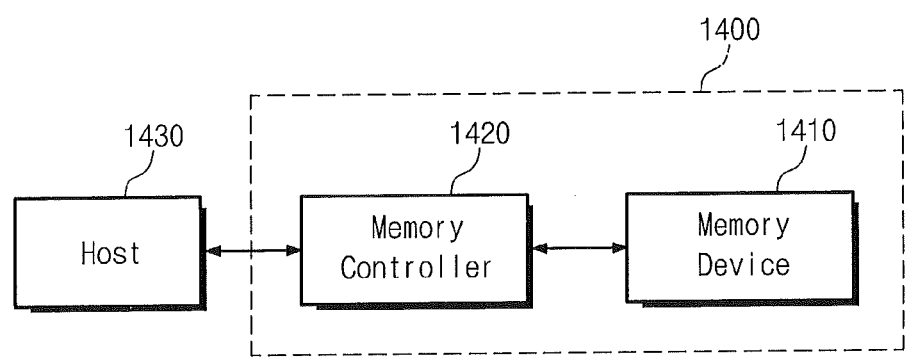
FIG. 22 is a block diagram schematically illustrating memory systems including a semiconductor device according to some embodiments of the inventive concept.

FIG. 22 is a block diagram schematically illustrating memory systems including a semiconductor device according to some embodiments of the inventive concept.

Referring to FIG. 22, a memory system including a semiconductor device according to some embodiments of the inventive concepts will be described. The memory system 1400 may include a memory device 1410 for storing huge amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device including a capacitor according to some embodiments of the inventive concept.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device, comprising:
a lower electrode on a substrate, the lower electrode including a seam therein;
a dielectric conformally covering the lower electrode;
an upper electrode covering the dielectric;
a cell gate electrode in the substrate with a gate insulating layer interposed between the substrate and the cell gate electrode;
a first doped region in the substrate adjacent to a first side of the cell gate electrode and electrically connected to the lower electrode;
a second doped region in the substrate adjacent to a second side of the cell gate electrode;
a contact plug interposed between the first doped region and the lower electrode; and
an adhesion layer interposed between the contact plug and the lower electrode,
wherein:
a central portion of a top surface of the lower electrode is substantially coplanar with or higher than an edge portion of the top surface of the lower electrode;
the lower electrode comprises a titanium nitride layer; and
the adhesion layer comprises a titanium layer.

2. The device of claim 1, wherein the lower electrode comprises a first lower electrode pattern defining a side surface of the seam and a second lower electrode pattern defining a top surface of the seam,
the first lower electrode pattern covers a side surface of the second lower electrode pattern, and
top surfaces of the first and second lower electrode patterns are in contact with the dielectric.

3. The device of claim 2, wherein the first and second lower electrode patterns comprises the same material.

4. The device of claim 1, wherein the lower electrode comprises a first lower electrode pattern having a hollow structure and a second lower electrode pattern provided in the first lower electrode pattern to define the seam,
the first lower electrode pattern covers a side surface of the second lower electrode pattern, and
top surfaces of the first and second lower electrode patterns are in contact with the dielectric.

5. The device of claim 1, wherein the seam is spaced apart from a bottom surface of the lower electrode.

6. The device of claim 1, wherein the substrate comprises a peripheral circuit region and a cell array region that includes the lower electrode, and
the semiconductor device further comprises:
a bit line provided on the cell array region and electrically connected to the second doped region; and
a peripheral gate electrode provided on the peripheral circuit region of the substrate, and
wherein the peripheral gate electrode comprises the same material as the bit line.

7. The device of claim 1, further comprising a supporting pattern in contact with a sidewall of the lower electrode.

8. The device of claim 7, wherein a top portion of the seam is positioned at a level equal to or lower than a bottom surface of the supporting pattern.

9. The device of claim 7, wherein a top surface of the lower electrode is positioned at a level equal to or higher than a top surface of the supporting pattern.

10. An integrated circuit device, comprising:
a lower capacitor electrode including a void therein, the lower capacitor electrode comprising;
a first lower capacitor electrode pattern having a hollow cylindrical shape and an opening in a first upper surface of the first lower capacitor electrode pattern; and
a second lower capacitor electrode pattern plugging the opening, wherein a second upper surface of the second lower capacitor electrode pattern is planar, and the first and second lower capacitor electrode patterns comprise titanium nitride;
a dielectric layer on a side and a top surface of the lower capacitor electrode; and
an upper electrode layer on the dielectric layer.

11. The integrated circuit device of claim 10, wherein the top surface of the lower capacitor electrode has a rounded edge.

12. The integrated circuit device of claim 10, wherein the second lower capacitor electrode pattern extends into the opening to contact an inner surface of the first lower capacitor electrode pattern.

13. The integrated circuit device of claim 12, wherein the second lower capacitor electrode pattern encloses the void.

14. The integrated circuit device of claim 10, wherein the lower capacitor electrode is one among a plurality of lower capacitor electrodes and the integrated circuit device further comprising a supporting pattern contacting sides of two adjacent lower capacitor electrodes of the plurality of lower capacitor electrodes, and wherein a top of the void is at an equal level or lower than a bottom surface of the supporting pattern.

15. An integrated circuit device, comprising:
a lower capacitor electrode on a substrate, wherein the lower capacitor electrode includes a void therein, and a top surface of the lower capacitor electrode has a central portion that is substantially coplanar with or higher than an edge portion, wherein the lower capacitor electrode comprises a first lower capacitor electrode;
an upper capacitor electrode on the lower capacitor electrode;
a dielectric layer extending between the lower and upper capacitor electrodes and overlying the lower capacitor electrode;
a supporting pattern contacting a sidewall of the lower capacitor electrode, wherein a top portion of the void is positioned at a level equal to or lower than a bottom surface of the supporting pattern relative to an upper surface of the substrate;
a second lower capacitor electrode on the substrate, the first and second lower capacitor electrodes being electrically connected to an active region that is in the substrate; and
a bit line crossing the active region, extending in a direction and being disposed between the first and second lower capacitor electrodes when viewed from a plan perspective, wherein the supporting pattern extends in the direction, at least partially overlaps with the bit line and contacts sidewalls of the first and second lower capacitor electrodes.

* * * * *